(12) United States Patent
Chun et al.

(10) Patent No.: US 6,171,926 B1
(45) Date of Patent: Jan. 9, 2001

(54) METHODS FOR FABRICATING INTEGRATED CIRCUIT CAPACITOR ELECTRODES USING FIRST AND SECOND INSULATING LAYERS AND A BUFFER LAYER

(75) Inventors: Kwang-Youl Chun; Young-Woo Park, both of Kyunggi-do; Yong-Jin Kim, Seoul, all of (KR)

(73) Assignee: Samsung Electronics Co., Ltd. (KR)

( * ) Notice: Under 35 U.S.C. 154(b), the term of this patent shall be extended for 0 days.

(21) Appl. No.: 09/289,364

(22) Filed: Apr. 9, 1999

(30) Foreign Application Priority Data

Apr. 10, 1999 (KR) .................................................. 98-12828

(51) Int. Cl.[7] .................................................... H01L 21/20

(52) U.S. Cl. .......................................... 438/396; 438/253

(58) Field of Search ..................................... 438/253, 254, 438/255, 396, 397, 398

(56) References Cited

U.S. PATENT DOCUMENTS

| 5,851,876 | * | 12/1998 | Jenq | ..................... | 438/253 |
| 5,858,832 | * | 1/1999 | Pan | ..................... | 438/250 |
| 5,863,821 | * | 1/1999 | Chao | ..................... | 438/253 |

* cited by examiner

*Primary Examiner*—Tuan H. Nguyen
(74) *Attorney, Agent, or Firm*—Myers Bigel Sibley & Sajovec

(57) ABSTRACT

Integrated circuit capacitor lower electrodes are fabricated by forming a plurality of spaced-apart contact pads on an integrated circuit substrate. A first insulating layer is formed on the integrated circuit substrate including on the contact pads. A plurality of spaced-apart conductive lines is formed on the first insulating layer that are laterally offset from the plurality of spaced-apart contact pads. A second insulating layer is formed on the first insulating layer including on the conductive lines. A buffer layer comprising material that is different from the second insulating layer, is formed on the second insulating layer. Openings are formed that extend through the buffer layer, through the second insulating layer and into the first insulating layer between the conductive lines to expose the contact pads. A conductive layer is formed in the openings and on the buffer layer. The conductive layer is etched between the openings to form the capacitor lower electrodes. The buffer layer preferably comprises material that has lower reflectivity than that of the second insulating layer and also preferably comprises material that has an etch rate for a predetermined etchant, that is intermediate that of the second insulating layer and the conductive layer. The first and second insulating layers preferably comprise silicon dioxide, the buffer layer preferably comprises at least one of silicon nitride and silicon oxynitride and the conductive layer preferably comprises polysilicon. During etching, a polymer preferably is formed on the capacitor lower electrode sidewalls adjacent the buffer layer. The etchant preferably is a plasma etchant including sulfur hexafluoride, chlorine and/or nitrogen gases.

18 Claims, 9 Drawing Sheets

US 6,171,926 B1

METHODS FOR FABRICATING INTEGRATED CIRCUIT CAPACITOR ELECTRODES USING FIRST AND SECOND INSULATING LAYERS AND A BUFFER LAYER

FIELD OF THE INVENTION

This invention relates to integrated circuit fabrication methods and more particularly to methods of fabricating integrated circuit capacitor electrodes.

BACKGROUND OF THE INVENTION

Integrated circuit capacitors are widely used in integrated circuit devices. For example, in Dynamic Random Access Memory (DRAM) devices, integrated circuit capacitors may be used to store charge thereon and thereby store data. As the integration density of DRAM devices continues to increase, it is desirable to maintain sufficiently high storage capacitance while decreasing the area of the integrated circuit substrate that is occupied by each capacitor.

When the integration density of the integrated circuit capacitors is increased, it may become more difficult to align the capacitor lower electrode, also referred to as a storage node, to an underlying contact hole. Moreover, in order to allow relatively high capacitance while decreasing the substrate surface area of the capacitor, the height of the storage node may increase as the area decreases. For example, the height of the storage node may increase to one micron or more in a stacked capacitor structure. This may result in a high aspect ratio of the storage node, for example, an aspect ratio exceeding 5. This high aspect ratio may make it difficult to pattern a thick conductive layer to form the storage nodes.

FIGS. 1 and 2 are cross-sectional views of DRAM cell capacitors which are fabricated by conventional methods, respectively taken along the word line direction and along the bit line direction of the DRAM device. As shown in FIGS. 1 and 2, a plurality of field effect transistors 3 are formed in an integrated circuit substrate 2 such as a monocrystalline silicon substrate. The field effect transistors 3 include insulated gate electrodes 7 with an insulating sidewall and capping layer 9 thereon. A plurality of spaced-apart source/drain regions 5 are also included in the integrated circuit substrate 2. Contact pads 4 are connected to respective source/drain regions 5. A first insulating layer such as a first oxide layer 6 is formed on the integrated circuit substrate 2 and a plurality of conductive lines such as bit lines 8 are formed thereon. A second insulating layer such as a second oxide layer 10 is formed on the first oxide layer 6 and on the bit lines 8.

A plurality of contact openings 11 are formed in the second and first oxide layers 10 and 6 to expose the contact pads 4. A conductive layer, preferably comprising polysilicon, is formed on the second oxide layer 10 including in the contact openings 11 at a thickness that determines the height of the storage node. An antireflective layer 13 is formed on the polysilicon layer in order to increase photolithographic resolution. The photoresist layer is formed on the antireflective layer 13 and patterned.

Using the patterned photoresist 14, the antireflective layer 13 and the polysilicon layer are anisotropically etched, for example using plasma etching gas containing sulfur hexafluoride ($SF_6$) and nitrogen ($N_2$) to form storage nodes 12. As is well known to those having skill in the art, an overetching process, for example using chlorine and nitrogen gas may be used during the step of etching a very tall polysilicon layer (for example about 10,000 Ångstroms in thickness) so as to obtain etching uniformity.

Unfortunately, during etching of the storage nodes 12, lateral etching may also occur, especially during the overetching process, which may cause a storage node to break. More specifically, as the etching process continues to expose the upper surface of the second oxide layer 10, the exposed surface of the second oxide layer 10 may be charged by ions of the etching gases, i.e., $SF_6^+$, $Cl_2^+$, and $N_2^+$, due to the large etch selectivity between the polysilicon layer and the underlying oxide layer 10. Therefore, etching ions that flow downstream in the direction of arrows 17 during the overetching process may be repelled by the charged oxide surface, thereby shifting the etching direction laterally towards the bottom sidewalls of the storage nodes 12 as shown by arrows 17. Therefore, the bottom sidewalls of the storage node may become etched due to shifting in etching direction as shown at reference numeral 18. Moreover, if misalignment occurs, the lateral and/or vertical overetching of the storage node may attack the misaligned portion and cause the storage node to break or become unduly thin.

SUMMARY OF THE INVENTION

It is therefore an object of the present invention to provide improved methods of fabricating integrated circuit capacitor lower electrodes.

It is another object of the present invention to provide integrated circuit capacitor lower electrode fabrication methods that can reduce lateral etching of the electrodes during patterning thereof.

It is still another object of the present invention to provide methods of fabricating integrated circuit capacitor lower electrodes that can allow adequate alignment margins to be present during fabrication.

It is yet another object of the present invention to provide methods of fabricating integrated circuit capacitor lower electrodes that can reduce breakage of the lower electrodes during fabrication thereof.

These and other objects are provided, according to the present invention, by forming a buffer layer comprising material that is different from the second insulating layer, on the second insulating layer. The buffer layer preferably comprises material that has lower reflectivity than that of the second insulating layer and also preferably comprises material that has an etch rate for a predetermined etchant, that is intermediate that of the second insulating layer and the conductive layer of the lower. electrode. Accordingly, the buffer layer can reduce the formation of ions therein during plasma etching and thereby reduce, and preferably prevent, lateral etching of the integrated circuit capacitor lower electrodes at the base thereof Alignment margins may thereby be increased and breaking of the storage node may be reduced and preferably prevented.

More specifically, integrated circuit capacitor lower electrodes are fabricated by forming a plurality of spaced-apart contact pads on an integrated circuit substrate. A first insulating layer is formed on the integrated circuit substrate including on the contact pads. A plurality of spaced-apart conductive lines is formed on the first insulating layer, that are laterally offset from the plurality of spaced-apart contact pads. A second insulating layer is formed on the first insulating layer including on the conductive lines. A buffer layer comprising material that is different from the second insulating layer, is formed on the second insulating layer. Openings are formed that extend through the buffer layer, through the second insulating layer and into the first insulating layer between the conductive lines to expose the contact pads. A conductive layer is formed in the openings and on the buffer layer. The conductive layer is etched between the openings to form the capacitor lower electrodes.

The buffer layer preferably comprises material that has lower reflectivity than that of the second insulating layer and also preferably comprises material that has an etch rate for a predetermined etchant, that is intermediate that of the second insulating layer and the conductive layer. The first and second insulating layers preferably comprise silicon dioxide, the buffer layer preferably comprises at least one of silicon nitride and silicon oxynitride and the conductive layer preferably comprises polysilicon. During etching, a polymer preferably is formed on the capacitor lower electrode sidewalls adjacent the buffer layer. The etchant preferably is a plasma etchant including sulfur hexafluoride, chlorine and/or nitrogen gases.

Prior to forming the spaced-apart contact pads, a plurality of spaced-apart source/drain regions may be formed in the integrated circuit substrate, and a plurality of insulated gate electrodes may be formed on the substrate therebetween. After forming the storage electrode, a dielectric layer and a capacitor upper electrode may be formed thereon to thereby form an integrated circuit capacitor. An antireflective layer also may be formed on the conductive layer. The antireflective layer preferably comprises the same material as the buffer layer.

It will be understood that the present invention may be used to fabricate other integrated circuit electrodes that extend between spaced-apart conductive lines. The capacitor lower electrodes may be used in DRAM devices or for other integrated circuit applications.

DETAILED DESCRIPTION OF PREFERRED EMBODIMENTS

Figure 1:
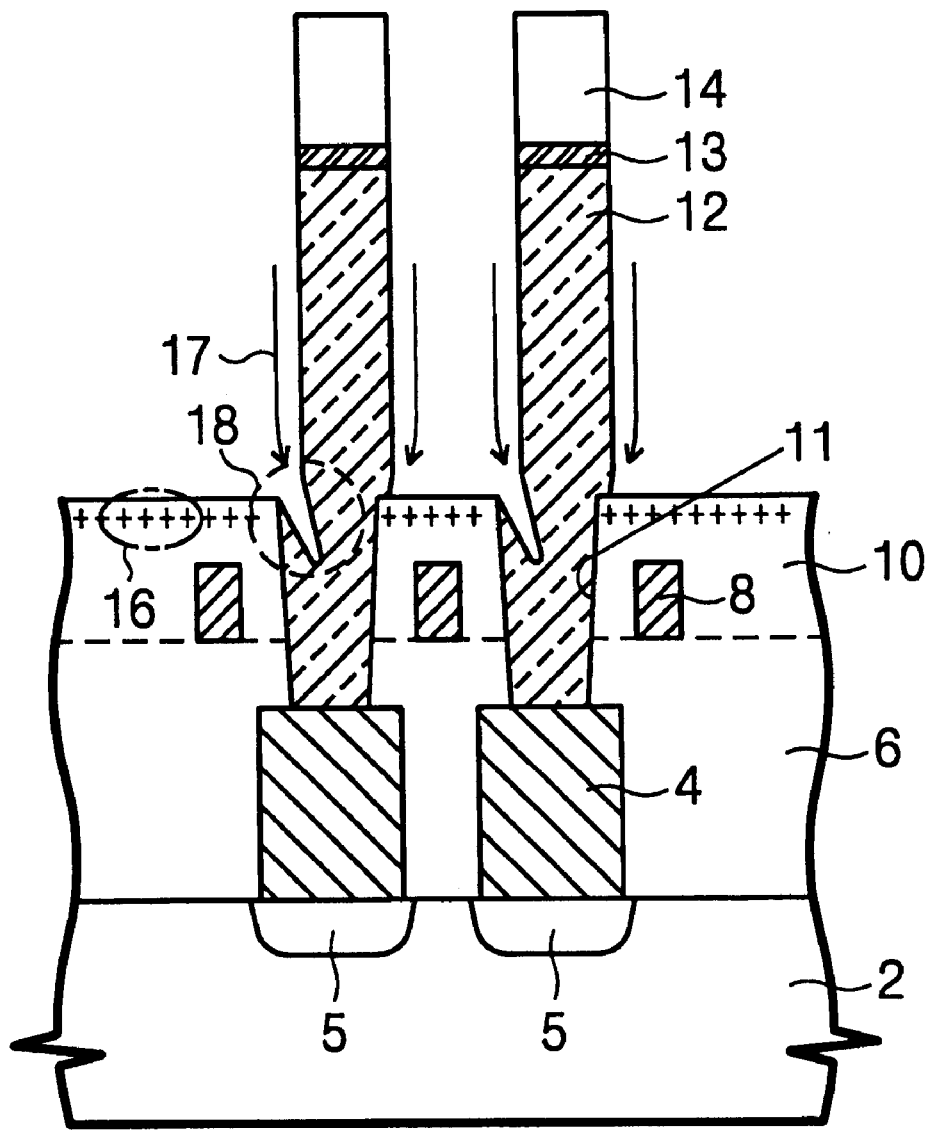
FIGS. 1 and 2 are cross-sectional views of integrated circuit capacitor lower electrodes that are fabricated by conventional methods, taken along the word line direction and the bit line direction, respectively.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

FIGS. 3A–3D are cross-sectional views illustrating methods of fabricating integrated circuit capacitors including lower electrodes according to the present invention, taken along the word line direction. FIGS. 4A–4D are cross-sectional views illustrating methods of fabricating integrated circuit capacitors including lower electrodes according to the present invention, taken along the bit line direction. In the detailed description that follows, FIGS. 3A–3D and 4A–4D will be referred to concurrently.

Figure 3A:
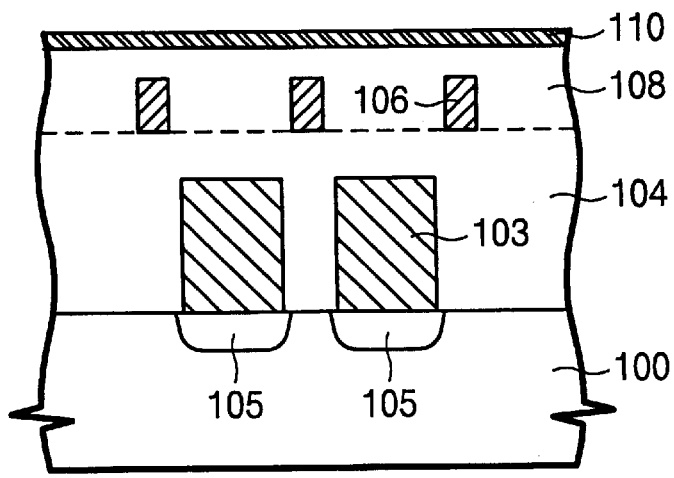
FIGS. 3A–3D are cross-sectional views illustrating methods of fabricating integrated circuit capacitors including lower electrodes according to the present invention, taken along the word line direction.
Figure 4A:
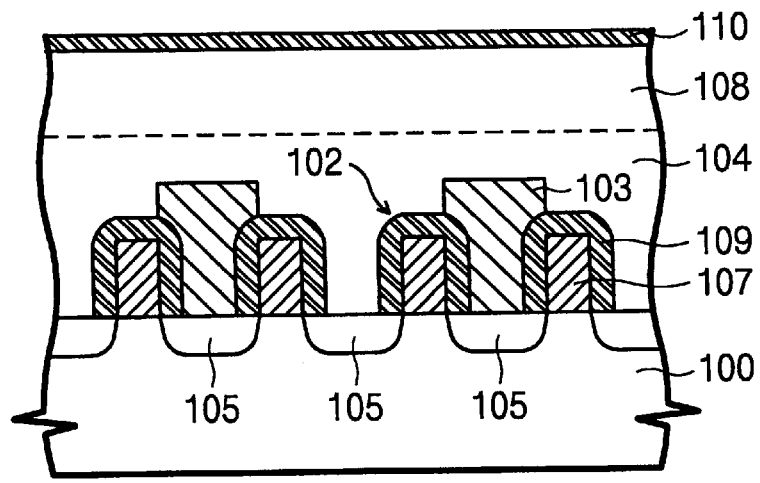
FIGS. 4A–4D are cross-sectional views illustrating methods of fabricating integrated circuit capacitors including lower electrodes according to the present invention, taken along the bit line direction.

Referring now to FIGS. 3A and 4A, a plurality of field effect transistors 102 are formed on an integrated circuit substrate such as a silicon semiconductor substrate 100. The field effect transistors include a plurality of spaced-apart source/drain regions 105 in the integrated circuit substrate 100 and a plurality of insulated gates 107 on the integrated circuit substrate therebetween. The insulated gates 107 may include an insulation layer 109 thereon comprising for example a gate sidewall and a gate capping layer which may be formed of silicon nitride and/or other conventional materials. Field isolation regions also may be used to isolate individual transistors from one another. Fabrication of field effect transistors 102 are well known to those having skill in the art and need not be described further herein.

Still referring to FIGS. 3A and 4A, a plurality of contact pads 103 are formed on the integrated circuit substrate, preferably in a self-aligned manner to the insulated gate electrodes 107, using techniques well known to those having skill in the art. It will be understood that although only two contacts pads 103 are shown in each of FIGS. 3A and 4A, an integrated circuit such as a DRAM integrated circuit generally includes many field effect transistors and contact pads.

Still referring to FIGS. 3A and 4A, a first insulating layer 104 such as a first silicon dioxide layer is formed on the integrated circuit substrate 100 including on the contact pads 103 and on the transistors 102. A plurality of spaced-apart conductive lines such as bit lines 106 are formed on the first insulating layer 104. A second insulating layer 108 such as a second silicon dioxide layer is then formed on the first insulating layer 104 including on the bit lines 106. The fabrication of the first and second insulating layers 104 and 108 and the conductive lines 106 is well known to those having skill in the art and need not be described further.

Finally, as shown in FIGS. 3A and 4A, a buffer layer 110 is formed on the second insulating layer 108. The buffer layer 110 is preferably an antireflective layer which has a relatively low reflection rate compared to the underlying second insulating layer 108. The buffer layer 110 may comprise silicon nitride ($Si_3N_4$) and/or silicon oxynitride (SiON). Preferably, the buffer layer 110 has an etch rate for a predetermined etchant, that is intermediate that of the second insulating layer 108 and the conductive layer that is formed later to produce the capacitor lower electrodes. The buffer layer 110 preferably has a thickness of between about 500 Ångstroms and about 1000 Ångstroms, and more preferably about 1000 Ångstroms. As will be described below, the buffer layer 110 can reduce the size of the contact openings that are formed to expose the contact pads 103 by providing an antireflective coating. The buffer layer 110 also can prevent lateral direction overetching by trapping fewer ions than the second insulating layer 108 during plasma etching. Moreover, the buffer layer 110 can enhance the buildup of a polymer on the base of the capacitor lower electrodes during the etching process.

Figure 3B:
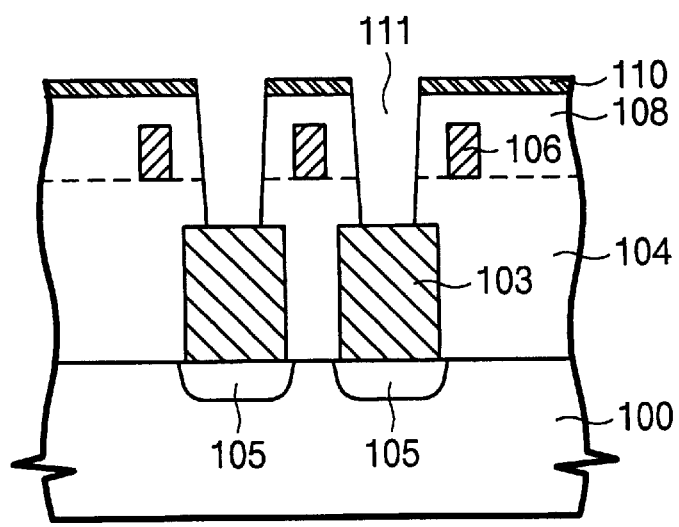
Figure 4B:
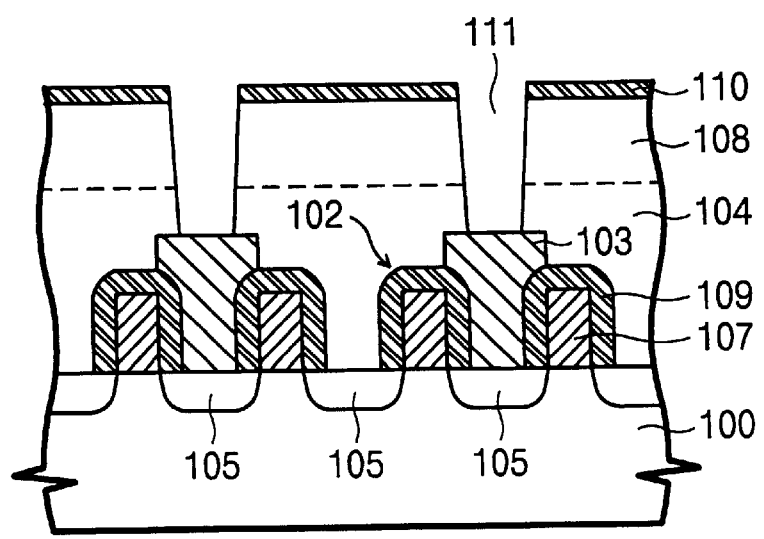

Referring now to FIGS. 3B and 4B, contact holes 111 are formed in the buffer layer 110, the second insulating layer 108 and the first insulating layer 104. It is desirable that the contact holes 111 have a reduced size while still allowing an overlap margin for the storage node. The antireflective properties of the buffer layer 110 can increase photolithographic resolution and thereby allow a reduction of the size of the openings compared to those which may be formed without a buffer layer having antireflective properties. Accordingly, misalignment margins can increase.

Figure 3C:
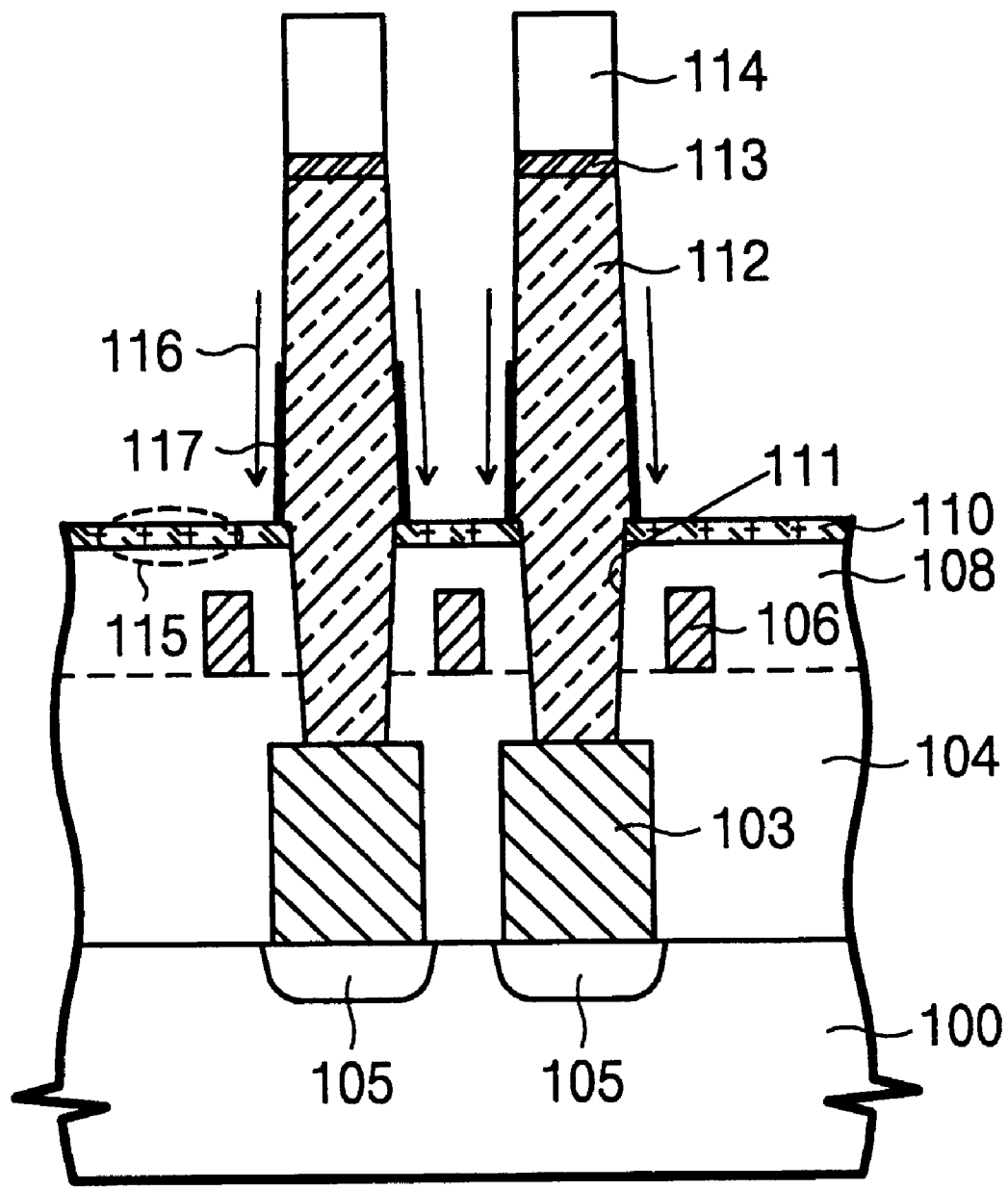
Figure 4C:
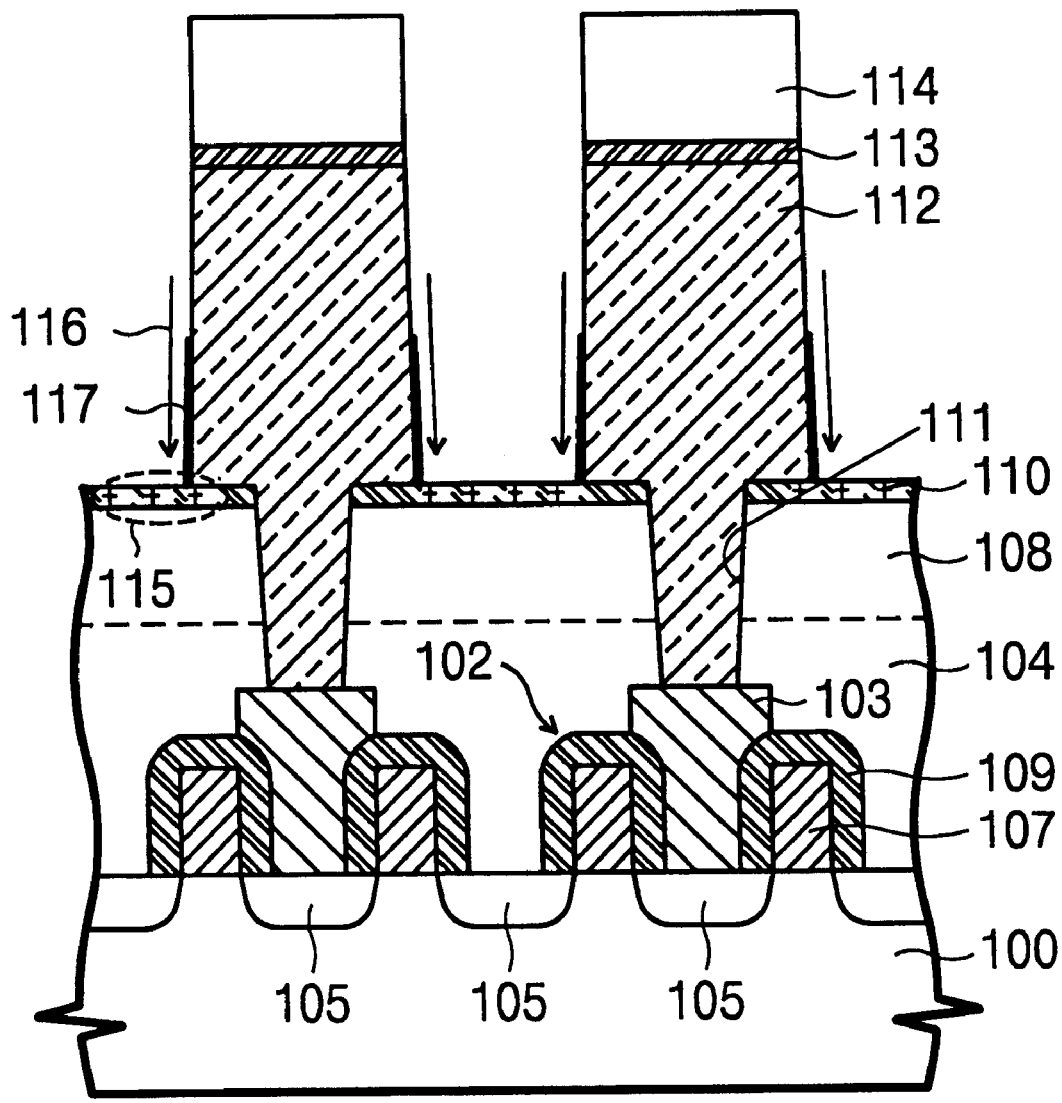

Referring now to FIGS. 3C and 4C, after forming the contact holes 111, a conductive layer, preferably comprising polysilicon, is formed on the buffer layer 110 including in the contact holes 111. The thickness of the polysilicon layer is preferably selected based on the desired height of the capacitor lower electrodes. As is well known, the height of the capacitor electrodes may be directly proportional to the capacitance of the capacitor that is eventually formed. An optional second antireflective coating layer 113 is formed on the polysilicon layer in order to allow an increase in photolithographic resolution. A photoresist pattern 114 is formed on the second antireflective coating layer to define storage nodes.

The conductive layer between the contact openings 111 is then etched using the photoresist pattern 114 as a mask. More specifically, the second antireflective coating layer 113 and the polysilicon layer are etched to form lower electrodes 112.

Figure 2:
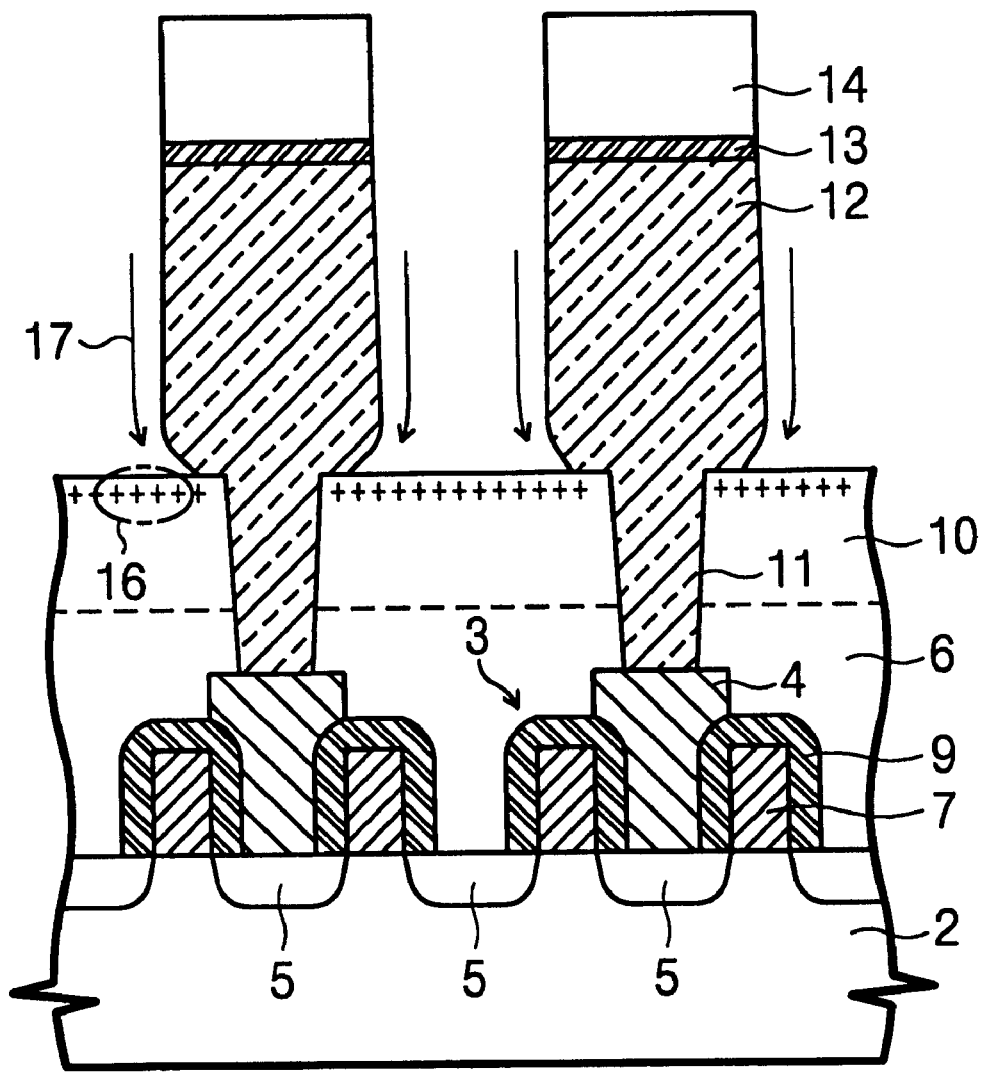

Anisotropic plasma etching is preferably provided using $SF_6$, $CL_2$ and $N_2$ gases to form the storage nodes 112. While forming the lower electrodes 112 a buildup of a polymer 117 is formed at the base of the lower electrodes adjacent the buffer layer 110. As described above, the buffer layer 110 preferably has an etch rate for the above-noted etchant, that is intermediate that of the second insulating layer 108 and the lower electrode 112. Accordingly, the surface of the buffer layer 110 retains a relatively small amount of charged ions such as $SF_6^+$, $CL_2^+$ and $N_2^+$, as illustrated at 115 in FIGS. 3C and 4C. Thus, fewer ions are present compared to a conventional etching method that does not employ a buffer layer, as shown by reference numeral 16 in FIGS. 1 and 2.

After the first etching step, overetching may be performed using $CL_2$ and $N_2$. During overetching, since the buffer layer 110 has a relatively low density of charged ions, the overetching using $CL_2$ and $N_2$ proceeds substantially vertically as shown by the arrows 116, to the surface of the buffer layer 110. There can be little, if any, change in etching direction from vertical to horizontal toward the bottom sidewalls of the lower electrodes 112. This should be compared to the etching direction arrows 17 of FIGS. 1 and 2. Thus, the polysilicon on the bottom sidewalls of the storage nodes is relatively unetched during the overetching process.

Moreover, as described above, a polymer 117 may be formed on the bottom sidewalls of the lower electrodes 112 due to the presence of the buffer layer 110 having antireflective properties. This polymer is preferably formed during the main etching step described above. The polymer 117 can increase the interface to the underlying contact openings 111, thereby increasing the overlap margin thereof. Moreover, the polymer 117 can protect the bottom sidewalls of the lower electrodes during the overetching process.

Figure 5:
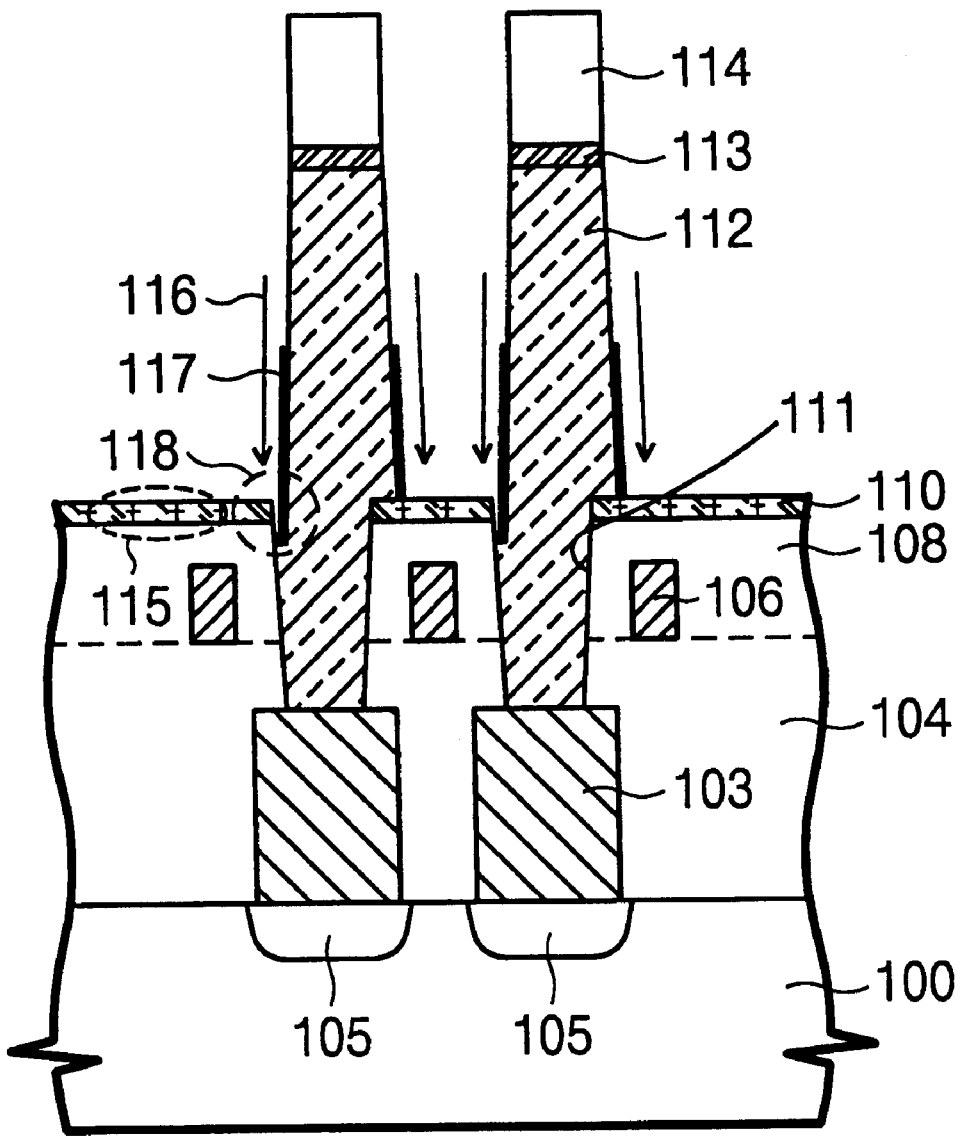
FIG. 5 is a cross-sectional view of an integrated circuit capacitor lower electrode according to the present invention with misaligned electrodes.

Accordingly, during main etching and overetching of the conductive polysilicon layer between the openings to form a capacitor lower electrode, anisotropic etching proceeds in the downward direction due to the action of the polymer layer 117 and the buffer layer 110. Therefore, even in the case of misalignment as shown in FIG. 5, the polysilicon in the contact openings 111 may be etched minimally, if at all.

Figure 3D:
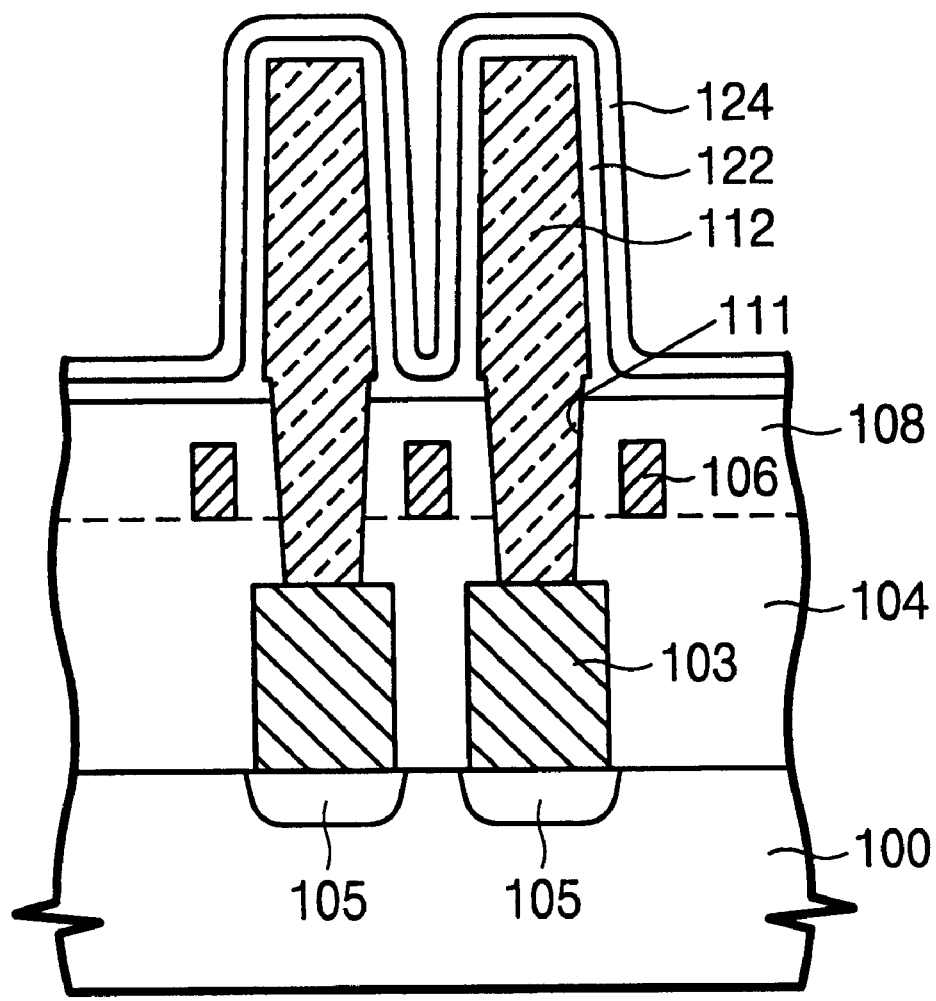
Figure 4D:
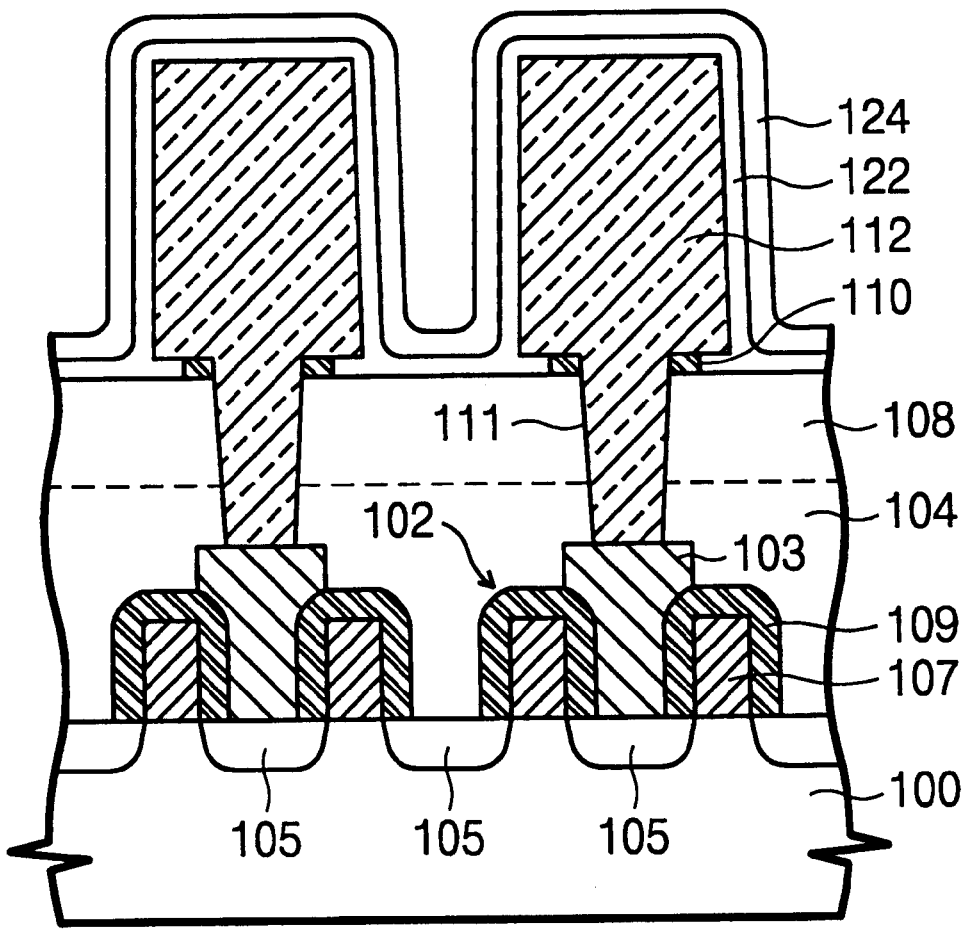

Finally, referring to FIGS. 3D and 4D, the photoresist pattern 114, the second antireflective layer 113 and the buffer layer 110 are removed, for example by wet etching in phosphoric acid. As shown in FIG. 4D, a portion of the antireflective coating 110 beneath the storage electrodes 112 also may be removed to increase the surface area of the capacitor lower electrodes 112. An optional process for forming Hemispherical Grain Silicon (HSG) may be preformed on the integrated circuit capacitor lower electrodes 112 to further increase the surface areas thereof. A dielectric film 122 and an upper electrode 124 are then formed to form the remainder of the capacitor using conventional techniques. Accordingly, a buffer layer that is formed on a second insulating layer may have antireflective properties and an intermediate etch rate to thereby reduce lateral etching of storage nodes. Breakage of the storage nodes also may be reduced.

In the drawings and specification, there have been disclosed typical preferred embodiments of the invention and, although specific terms are employed, they are used in a generic and descriptive sense only and not for purposes of limitation, the cope of the invention being set forth in the following claims.

What is claimed is:

1. A method of fabricating an integrated circuit capacitor lower electrode comprising the steps of:

forming a plurality of spaced-apart contact pads on an integrated circuit substrate;

forming a first insulating layer on the integrated circuit substrate including on the contact pads;

forming a plurality of spaced-apart conductive lines on the first insulating layer;

forming a second insulating layer on the first insulating layer including on the conductive lines;

forming a buffer layer comprising material that is different from the second insulating layer, on the second insulating layer;

forming openings that extend through the buffer layer, through the second insulating layer and into the first insulating layer between the conductive lines to expose the contact pads;

forming a conductive layer in the openings and on the buffer layer; and selectively anisotropically etching the conductive layer between the openings to form the capacitor lower electrode using etchant that forms a polymer on the sidewall of the capacitor lower electrode, adjacent the buffer layer, wherein the buffer layer reduces lateral etching of the capacitor lower electrode adjacent the buffer layer during the selective anisotropic etching, compared to absence thereof.

2. A method according to claim 1 wherein the step of forming a buffer layer comprises the step of forming a buffer layer comprising material that has lower reflectivity than that of the second insulating layer, on the second insulating layer.

3. A method according to claim 1 wherein the step of forming a buffer layer comprises the step of forming a buffer layer comprising material that has an etch rate for a predetermined etchant, that is intermediate that of the second insulating layer and the conductive layer, on the second insulating layer.

4. A method according to claim 1 wherein the first and second insulating layers comprise silicon dioxide, wherein the buffer layer comprises at least one of silicon nitride and silicon oxynitride and wherein the conductive layer comprises polysilicon.

5. A method according to claim 1 wherein the etchant is a plasma etchant including sulfu hexafluoride, chlorine and nitrogen gasses.

6. A method according to claim 1:
   wherein the step of forming a plurality of spaced-apart contact pads on an integrated circuit substrate is preceded by the step of forming a plurality of spaced-apart source/drain regions in the integrated circuit substrate; and
   wherein the step of forming a plurality of spaced-apart contact pads on an integrated circuit substrate comprises the step of forming a plurality of spaced-apart contact pads on the integrated circuit substrate that electrically contact a respective source/drain region.

7. A method according to claim 1 wherein the step of selectively anisotropically etching the conductive layer is followed by the steps of forming a dielectric layer on the capacitor lower electrode and forming a capacitor upper electrode on the dielectric layer.

8. A method according to claim 1 wherein the following step is performed between the steps of forming a conductive layer in the openings and on the buffer layer and selectively anisotropically etching the conductive layer between the openings to form the capacitor lower electrode:
   forming an antireflective layer on the conductive layer, the antireflective layer comprising same material as the buffer layer; and
   wherein the step of selectively anisotropically etching the conductive layer comprises the step of selectively anisotropically etching the antireflective layer and the conductive layer between the openings to form the capacitor lower electrode.

9. A method according to claim 1 wherein the step of selectively anisotropically etching is followed by the step of removing the buffer layer from the second insulating layer.

10. A method according to claim 1 wherein the step of forming a buffer layer comprises the step of forming a buffer layer comprising material that has lower reflectivity than that of the second insulating layer and that has an etch rate for a predetermined etchant, that is intermediate that of the second insulating layer and the conductive layer, on the second insulating layer.

11. A method of fabricating an integrated circuit electrode comprising the steps of:
   forming an insulating layer on the integrated circuit substrate;
   forming a buffer layer comprising material that is different from that of the insulating layer, on the insulating layer;
   forming openings that extend through the buffer layer and through the insulating layer;
   forming a conductive layer in the openings and on the buffer layer; and
   selectively anisotropically etching the conductive layer between the openings to form the electrode using etchant that forms a polymer on the sidewall of the electrode, adjacent the buffer layer, wherein the buffer layer reduces lateral etching of the lower electrode adjacent the buffer layer during the selective anisotropic etching, compared to absence thereof.

12. A method according to claim 11 wherein the step of forming a buffer layer comprises the step of forming a buffer layer comprising material that has lower reflectivity than that of the insulating layer, on the insulating layer.

13. A method according to claim 11 wherein the step of forming a buffer layer comprises the step of forming a buffer layer comprising material that has an etch rate for a predetermined etchant, that is intermediate that of the insulating layer and the conductive layer, on the insulating layer.

14. A method according to claim 11 wherein the insulating layer comprises silicon dioxide, wherein the buffer layer comprises at least one of silicon nitride and silicon oxynitride and wherein the conductive layer comprises polysilicon.

15. A method according to claim 11 wherein the etchant is a plasma etchant including sulfur hexafluoride, chlorine and nitrogen gasses.

16. A method according to claim 11 wherein the following step is performed between the steps of forming a conductive layer in the openings and on the buffer layer and selectively anisotropically etching the conductive layer between the openings to form the electrode:
   forming an antireflective layer on the conductive layer, the antireflective layer comprising same material as the buffer layer; and
   wherein the step of selectively anisotropically etching the conductive layer comprises the step of selectively anisotropically etching the antireflective layer and the conductive layer between the openings to form the electrode.

17. A method of fabricating an integrated circuit capacitor lower electrode comprising the steps of:
   forming a plurality of spaced-apart contact pads on an integrated circuit substrate;
   forming a first insulating layer on the integrated circuit substrate including on the contact pads;
   forming a plurality of spaced-apart conductive lines on the first insulating layer;
   forming a second insulating layer on the first insulating layer including on the conductive lines;
   forming a buffer layer comprising material that has lower reflectivity than that of the second insulating layer and that has an etch rate for a predetermined etchant, that is intermediate that of the second insulating layer and the conductive layer, on the second insulating layer;
   forming openings that extend through the buffer layer, through the second insulating layer and into the first insulating layer between the conductive lines to expose the contact pads;
   forming a conductive layer in the openings and on the buffer layer; and
   selectively anisotropically etching the conductive layer to form the capacitor lower electrode, using etchant that forms a polymer on the capacitor lower electrode, adjacent the buffer layer, wherein the polymer reduces lateral etching of the capacitor lower electrode adjacent the buffer layer during the selective anisotropic etching, compared to absence of the polymer.

18. A method according to claim 17 wherein the first and second insulating layers comprise silicon dioxide, wherein the buffer layer comprises at least one of silicon nitride and silicon oxynitride and wherein the conductive layer comprises polysilicon.

* * * * *

UNITED STATES PATENT AND TRADEMARK OFFICE
CERTIFICATE OF CORRECTION

PATENT NO. : 6,171,926 B1
DATED : January 9, 2001
INVENTOR(S) : Kwang-Youl Chun et al.

It is certified that error appears in the above-identified patent and that said Letters Patent is hereby corrected as shown below:

Item (30), Foreign Application Priority Data
April 10, 1998 (KR).........................................98-12828

Signed and Sealed this

Twenty-third Day of October, 2001

Attest:

*Nicholas P. Godici*

NICHOLAS P. GODICI
*Acting Director of the United States Patent and Trademark Office*

*Attesting Officer*